United States Patent
Ma

(10) Patent No.: US 10,823,697 B2
(45) Date of Patent: Nov. 3, 2020

(54) THIN FILM TRANSISTOR, SENSOR, BIOLOGICAL DETECTION DEVICE AND METHOD

(71) Applicant: BOE TECHNOLOGY GROUP CO., LTD., Beijing (CN)

(72) Inventor: Xiaochen Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 134 days.

(21) Appl. No.: 16/238,721

(22) Filed: Jan. 3, 2019

(65) Prior Publication Data

US 2019/0323987 A1 Oct. 24, 2019

(30) Foreign Application Priority Data

Apr. 24, 2018 (CN) .......................... 2018 1 0371909

(51) Int. Cl.
*G01N 27/414* (2006.01)
*H01L 29/786* (2006.01)

(52) U.S. Cl.
CPC ... *G01N 27/4145* (2013.01); *H01L 29/78648* (2013.01)

(58) Field of Classification Search
CPC .......... G01N 27/4145; H01L 29/66484; H01L 29/7832; H01L 2924/1306; H01L 2924/13072; H01L 2924/13074; H01L 2924/13085
See application file for complete search history.

(56) References Cited

U.S. PATENT DOCUMENTS

| 9,664,642 | B2 * | 5/2017 | Takechi | G01N 27/4145 |
| 9,689,835 | B2 * | 6/2017 | Liu | G01N 27/4148 |
| 9,958,443 | B2 * | 5/2018 | Lin | H01L 29/7832 |
| 10,094,801 | B2 * | 10/2018 | Liu | H01L 51/0093 |
| 10,254,244 | B1 * | 4/2019 | Cheng | H01L 29/42384 |

(Continued)

FOREIGN PATENT DOCUMENTS

| CN | 104835835 A | | 8/2015 |
| CN | 105954322 A | * | 9/2016 |

OTHER PUBLICATIONS

Liang, et al., "Extended-gate-type IGZO electric-double-layer TFT immunosensor with high sensitivity and low operation voltage", American Institute of Physics; Appl. Phys. Lett., 109, 173501 (2016; http://dx.doi.org.10.1063/1.4966221.

(Continued)

*Primary Examiner* — Earl N Taylor
(74) *Attorney, Agent, or Firm* — The Webb Law Firm

(57) ABSTRACT

The present disclosure provides a thin film transistor, a sensor, a biological detection device and a method. The thin film transistor includes a substrate, a first gate, a first dielectric layer, a source, a drain, a semiconductor layer, a second dielectric layer, and a second gate. The first gate is on the substrate. The first dielectric layer is on the substrate and the first gate. The source, the drain, and the semiconductor layer are on a side of the first dielectric layer facing away from the first gate. The second dielectric layer is on the first dielectric layer and the semiconductor layer. A material of the second dielectric layer is a solid state electrolyte material. The second gate is on a side of the second dielectric layer facing away from the semiconductor layer.

19 Claims, 10 Drawing Sheets

(56) References Cited

U.S. PATENT DOCUMENTS

| | | | | |
|---|---|---|---|---|
| 10,629,834 B2* | 4/2020 | Liu | ................... | H01L 29/7869 |
| 2017/0160226 A1* | 6/2017 | Huang | ............... | G01N 27/4148 |
| 2017/0205371 A1* | 7/2017 | Liu | ................... | G01N 27/4148 |
| 2017/0227533 A1* | 8/2017 | Lin | ................... | G01N 27/4148 |
| 2019/0137443 A1* | 5/2019 | Balijepalli | ........ | B01L 3/502715 |
| 2019/0267559 A1* | 8/2019 | Liu | ................... | H01L 51/4213 |
| 2019/0323987 A1* | 10/2019 | Ma | ................... | G01N 27/4145 |

OTHER PUBLICATIONS

Liu, et al., "Low-Cost pH Sensors Based on Low-Voltage Oxide-Based Electric-Double-Layer Thin Film Transistors"; IEEE Electron Device Letters, vol. 35, No. 4, Apr. 2014; pp. 482-484.

Ma, et al., "A Sputtered Silicon Oxide Electrolyte for High-Performance Thin-Film Transistors", Scientific Reports, 7:809; Apr. 11, 2017; pp. 1-6.

\* cited by examiner

THIN FILM TRANSISTOR, SENSOR, BIOLOGICAL DETECTION DEVICE AND METHOD

CROSS-REFERENCE TO RELATED APPLICATIONS

The present application claims priority to Chinese Patent Application No. 201810371909.6, filed on Apr. 24, 2018, the disclosure of which is incorporated by reference herein in its entirety.

TECHNICAL FIELD

The present disclosure relates to a thin film transistor, a sensor, a biological detection device and a method.

BACKGROUND

At present, an electrolyte gate dielectric has gradually attracted widespread attention. The movable ions inside the electrolyte gate dielectric can move under a small gate voltage, so that an electric double layer is formed at an interface of the electrolyte and an active layer, resulting in a large capacitance. Therefore, compared to a conventional TFT, a TFT (Thin Film Transistor) using an electrolyte as the gate dielectric is more sensitive to a voltage applied to the gate.

SUMMARY

According to an aspect of embodiments of the present disclosure, there is provided a thin film transistor comprising: a substrate; a first gate on the substrate; a first dielectric layer on the substrate and the first gate, wherein an orthographic projection of the first gate on the substrate is within an orthographic projection of the first dielectric layer on the substrate; a source, a drain, and a semiconductor layer on a side of the first dielectric layer facing away from the first gate, the source and the drain being respectively connected to the semiconductor layer, both an orthographic projection of the source on the substrate and an orthographic projection of the drain on the substrate being within an orthographic projection of the semiconductor layer on the substrate; a second dielectric layer on the first dielectric layer and the semiconductor layer, a material of the second dielectric layer being a solid state electrolyte material, wherein an orthographic projection of the semiconductor layer on the substrate is within an orthographic projection of the second dielectric layer on the substrate; and a second gate on a side of the second dielectric layer facing away from the semiconductor layer.

In some embodiments, the thin film transistor further comprises: a first port layer above the substrate, the first port layer being spaced apart from the first gate; and a second port layer connected to the second gate, the second port layer being isolated from the first port layer by the first dielectric layer.

In some embodiments, a material of the first port layer is the same as a material of the first gate, and the first port layer is in the same layer as the first gate; a material of the second port layer is the same as a material of the second gate, and the second port layer is in the same layer as the second gate.

In some embodiments, the thin film transistor further comprises: a cover layer on the second gate and the second port layer.

In some embodiments, the solid state electrolyte material comprises at least one of an organic polyelectrolyte material and an inorganic electrolyte material.

In some embodiments, the source and the drain are between the semiconductor layer and the first dielectric layer; or the source and the drain are on a side of the semiconductor layer facing away from the first dielectric layer.

According to another aspect of embodiments of the present disclosure, there is provided a sensor comprising the thin film transistor as described above.

In some embodiments, the sensor further comprises a detection unit, wherein the detection unit comprises: a first detection portion electrically connected to the first port layer of the thin film transistor; and a second detection portion electrically connected to the second port layer of the thin film transistor.

In some embodiments, the sensor further comprises: a capping plate disposed opposite to the substrate of the thin film transistor and above the second gate; and an encapsulation portion between the capping plate and the substrate; wherein, the capping plate, the encapsulation portion and the thin film transistor enclose a flow passage, the first port layer and the second port layer of the thin film transistor respectively abutting the flow passage.

According to another aspect of embodiments of the present disclosure, there is provided a biological detection device comprising the thin film transistor as described above.

According to another aspect of embodiments of the present disclosure, there is provided a biological detection device comprising the sensor as described above.

According to another aspect of embodiments of the present disclosure, there is provided a method of manufacturing a thin film transistor, comprising: forming a first gate on a substrate; forming a first dielectric layer on the substrate and the first gate, wherein an orthographic projection of the first gate on the substrate is within an orthographic projection of the first dielectric layer on the substrate; forming a source, a drain, and a semiconductor layer on a side of the first dielectric layer facing away from the first gate, the source and the drain being respectively connected to the semiconductor layer, both an orthographic projection of the source on the substrate and an orthographic projection of the drain on the substrate being within an orthographic projection of the semiconductor layer on the substrate; forming a second dielectric layer on the first dielectric layer and the semiconductor layer, a material of the second dielectric layer being a solid state electrolyte material, wherein an orthographic projection of the semiconductor layer on the substrate is within an orthographic projection of the second dielectric layer on the substrate; and forming a second gate on a side of the second dielectric layer facing away from the semiconductor layer.

In some embodiments, the method further comprises: forming a first port layer above the substrate during formation of the first gate, the first port layer being spaced apart from the first gate; and forming a second port layer connected to the second gate during formation of the second gate, wherein the second port layer is isolated from the first port layer by the first dielectric layer.

In some embodiments, the first port layer and the first gate are formed in the same patterning process; the second port layer and the second gate are formed in the same patterning process.

In some embodiments, the method further comprises: forming a cover layer on the second gate and the second port layer.

In some embodiments, the step of forming the source, the drain and the semiconductor layer comprises: forming a source and a drain on a side of the first dielectric layer facing away from the first gate; and forming a semiconductor layer on the first dielectric layer, the source and the drain; or forming a semiconductor layer on a side of the first dielectric layer facing away from the first gate; and forming a source and a drain on a side of the semiconductor layer facing away from the first dielectric layer.

According to another aspect of embodiments of the present disclosure, there is provided a method of detecting a sample using a thin film transistor, wherein the thin film transistor comprises: a substrate; a first gate on the substrate; a first dielectric layer on the substrate and the first gate; a source, a drain, and a semiconductor layer on a side of the first dielectric layer facing away from the first gate, the source and the drain being respectively connected to the semiconductor layer; a second dielectric layer on the first dielectric layer and the semiconductor layer, a material of the second dielectric layer being a solid state electrolyte material; a second gate on a side of the second dielectric layer facing away from the semiconductor layer; a first port layer above the substrate, the first port layer being spaced apart from the first gate; and a second port layer connected to the second gate, the second port layer being isolated from the first port layer by the first dielectric layer; the method comprising: applying an adjustment voltage to the first gate such that the thin film transistor is in a sensitive working range; connecting the first port layer and the second port layer to a sample to be detected, respectively; applying a detection voltage to the first port layer; and obtaining an output current from the source or the drain, and obtaining a detection result of the sample according to the output current.

In some embodiments, before applying an adjustment voltage to the first gate, the method further comprises: obtaining the sensitive working range of the thin film transistor.

In some embodiments, the step of obtaining the sensitive working range comprises: applying a scan voltage $V_G$ to the second gate; obtaining a current $I_D$ from the source or the drain to obtain an $I_D$-$V_G$ characteristic curve regarding the current $I_D$ and the scan voltage $V_G$; and determining a voltage range with the largest slope of curve from the $I_D$-$V_G$ characteristic curve as the sensitive working range of the thin film transistor.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
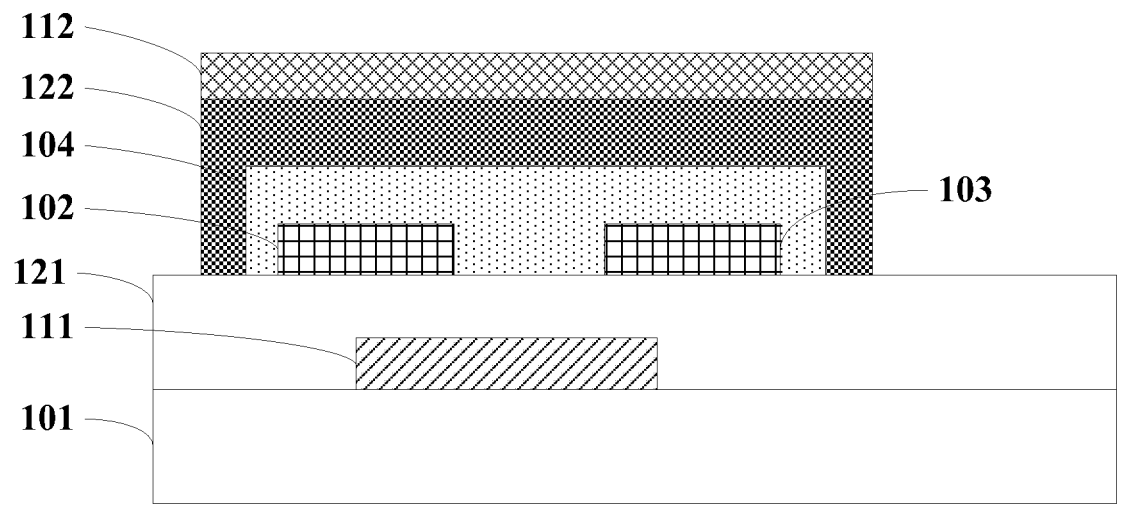
FIG. 1A is a cross sectional view showing a thin film transistor according to some embodiments of the present disclosure.

It should be understood that the dimensions of the various parts shown in the drawings are not drawn to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is in fact merely illustrative and is in no way intended as a limitation to the present disclosure, its application or use. The present disclosure may be implemented in many different forms, not limited to the embodiments described herein. These embodiments are provided so that this disclosure will be thorough and complete, and will fully convey the scope of the disclosure to those skilled in the art. Notice that, Unless specifically stated otherwise, relative arrangement of components and steps, material composition, numerical expressions, and numerical values set forth in these embodiments are to be construed as merely illustrative, and not as a limitation.

The use of the terms "first", "second" or the like in the present disclosure does not denote any order, quantity or importance, but are merely used to distinguish between different components. A word such as "comprises" or "includes" means that the element before the word covers the elements listed after the word, without excluding the possibility of also covering other elements. The terms "up", "down", "left", "right" or the like are used only to represent a relative positional relationship, and the relative positional relationship may be changed if the absolute position of the described object changes.

In the present disclosure, when it is described that a specific component is disposed between a first component and a second component, there may be an intervening component between the specific component and the first component or the second component, or there may be no intervening component. When it is described that a specific component is connected to other components, the specific component may be directly connected to the other components without intervening components, or may have an intermediate component without being directly connected with the other components.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of the specification.

In the related art, since electrolytes are mostly in a liquid state, they are difficult to match with solid devices, and their stability is poor. In addition, it is difficult to adapt the manufacturing process of devices using liquid electrolytes to mass production technology. All these facts lead to electrolyte devices not being widely used and mass produced.

In view of this, embodiments of the present disclosure provide an electrolyte device with strong stability. For example, embodiments of the present disclosure provide a thin film transistor based on a solid state electrolyte material. A thin film transistor according to some embodiments of the present disclosure will be described in detail below with reference to the accompanying drawings.

FIG. 1A is a cross sectional view showing a thin film transistor according to some embodiments of the present disclosure.

As shown in FIG. 1A, the thin film transistor comprises a substrate 101 and a first gate 111 on the substrate 101. A material of the first gate 111 comprises a conductive material such as metal or the like.

As shown in FIG. 1A, the thin film transistor further comprises a first dielectric layer 121 on the substrate 101 and the first gate 111. An orthographic projection of the first gate 111 on the substrate 101 is within an orthographic projection of the first dielectric layer 121 on the substrate 101. For example, a material of the first dielectric layer 121 comprises an insulating material such as $SiO_2$, $Al_2O_3$, SiN or the like. For another example, the material of the first dielectric layer 121 comprises a high dielectric constant material such as $HfO_2$ or $Ta_2O_5$ or the like. As still another example, the material of the first dielectric layer 121 comprises an organic insulating material such as PMMA (polymethyl methacrylate), a photoresist or the like.

As shown in FIG. 1A, the thin film transistor further comprises a source 102, a drain 103, and a semiconductor layer 104 on a side of the first dielectric layer 121 facing away from the first gate 111. The source 102 and the drain 103 are respectively connected to the semiconductor layer 104. Both an orthographic projection of the source 102 on the substrate 101 and an orthographic projection of the drain 103 on the substrate 101 are within an orthographic projection of the semiconductor layer 104 on the substrate 101. The source 102 and the drain 103 are spaced apart from each other. For example, the source 102 and the drain 103 are on a surface of the first dielectric layer 121. For example, the source 102 and the drain 103 are between the semiconductor layer 104 and the first dielectric layer 121.

In some embodiments, the materials of the source 102 and the drain 103 are both a conductive material. For example, the conductive material comprises, but not limited to, a metal material, a conductive oxide material (e.g., ITO (Indium Tin Oxide), IZO (Indium Zinc Oxide), or AZO (Aluminum Zinc Oxide), etc.) or a conductive nonmetallic material (for example, graphite, graphene, carbon nanotubes, an organic conductive material, etc.) or the like.

The semiconductor layer 104 may also be referred to as an active layer for forming a channel region. For example, a material of the semiconductor layer 104 is an organic material or an inorganic material.

As shown in FIG. 1A, the thin film transistor further comprises a second dielectric layer 122 on the first dielectric layer 121 and the semiconductor layer 104. A material of the second dielectric layer 122 is a solid state electrolyte material. For example, the solid state electrolyte material comprises at least one of an organic polyelectrolyte material and an inorganic electrolyte material. For example, the organic polyelectrolyte material comprises polyvinyl alcohol+potassium fluoride (PVA+KF), polyethylene oxide+lithium hexafluorophosphate (PEO+$LiPF_6$), polyethylene oxide (PEO)/$LiClO_4$, poly (styrenesulfonic acid) (PSSH), poly (vinylidene fluoride-co-ethylene-trifluoroethylene) (P(VDF-TrFE)), or the like. For example, the inorganic electrolyte material comprises porous $SiO_2$, porous $Al_2O_3$, a composite material comprising $CaCl_2$ and porous $SiO_2$, a composite material comprising LiCl and porous $SiO_2$, $SiO_2$ nanoparticles, $Al_2O_3$ nanoparticles, zeolite, sodium alginate, phosphosilicate glass, or the like. An orthographic projection of the semiconductor layer 104 on the substrate 101 is within an orthographic projection of the second dielectric layer 122 on the substrate 101.

As shown in FIG. 1A, the thin film transistor further comprises a second gate 112 on a side of the second dielectric layer 122 facing away from the semiconductor layer 104. The second gate 112 is on the second dielectric layer 122. For example, a material of the second gate 112 comprises a conductive material (such as a metal material), or the like.

In the above embodiment, a thin film transistor having dual gates according to some embodiments of the present disclosure is provided. This thin film transistor has the characteristic of strong stability. The material of the second dielectric layer is a solid state electrolyte material. Thus, with a weak gate voltage (i.e., a voltage applied to the second gate), an electric double layer may be formed in the second dielectric layer and the semiconductor layer (i.e., an ion layer in the second dielectric layer and a carrier layer in the semiconductor layer), which produces a huge capacitance. This affects the output current of the thin film transistor. Therefore, this thin film transistor is very sensitive to the gate voltage and has a high detection sensitivity.

For example, for a thin film transistor, a gate voltage fluctuation within 1 V can cause a source-drain current variation of 4 to 5 orders of magnitude. Therefore, the thin film transistor has a high sensitivity even to weak electric signals below 1V.

In the thin film transistor in the above embodiment, the first gate 111 may function to adjust a threshold voltage ($V_{th}$) of the TFT. By applying an appropriate voltage to the first gate, the output current (i.e., the current between the source and the drain) of the thin film transistor can be adjusted to a working range sensitive to the voltage signal of the second gate. This serves to increase the sensitivity of the thin film transistor. Here, the sensitive working range refers to a voltage range in which the output current of the thin film transistor is sensitive to the voltage applied to the second gate.

For example, for the thin film transistor of some embodiments, the sensitive working range refers to a voltage range with the largest curve slope in an $I_D$-$V_G$ characteristic curve formed by the current $I_D$ output from the source or the drain and the gate voltage $V_G$ of the second gate. That is, a voltage range where the subthreshold swing (referred to as S.S.) in the TFT transfer characteristic curve takes the smallest value. For example, the voltage range is [−5V, 5V]. Of course, those skilled in the art will appreciate that different thin film transistors may have different sensitive working ranges. Therefore, the scope of embodiments of the present disclosure is not limited to the sensitive working range illustrated herein.

In some embodiments, for some thin film transistors that are themselves in a sensitive working range, it is not required to apply a voltage to the first gate 111 or the first gate 111 may be omitted. For example, a thickness of the first dielectric layer, a thickness of the semiconductor layer and a doping concentration of the semiconductor layer may be adjusted such that the sensitive working range of the thin film transistor is in the vicinity of a first gate voltage of 0V. Thus, the thin film transistor may operate without a voltage applied to the first gate 111, or the first gate may be omitted during the manufacturing process.

Figure 1B:
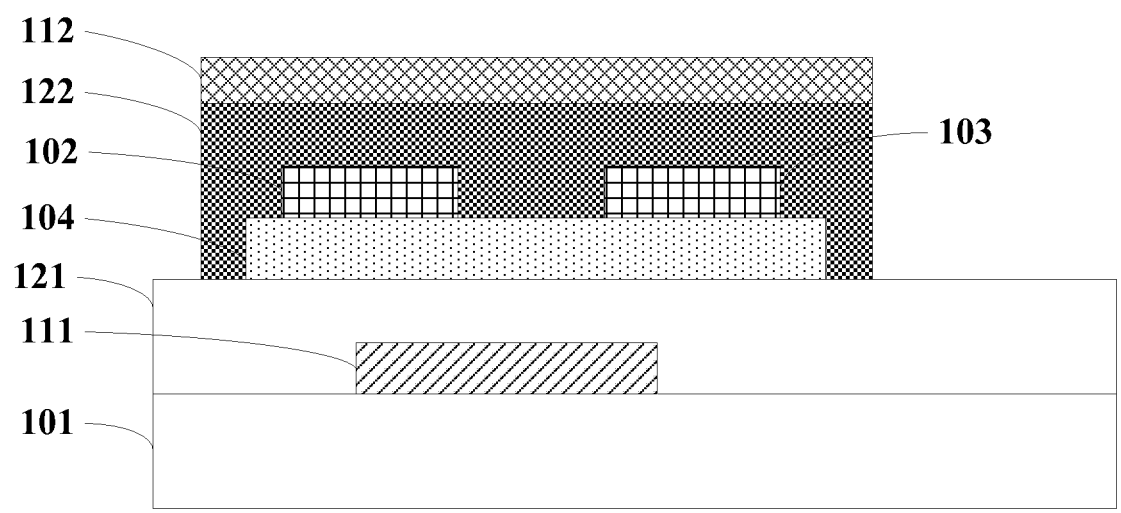
FIG. 1B is a cross sectional view showing a thin film transistor according to other embodiments of the present disclosure.

FIG. 1B is a cross sectional view showing a thin film transistor according to other embodiments of the present disclosure. On the basis of the embodiment shown in FIG. 1A, the position of the semiconductor layer 104 is interchanged with the position of the source 102/drain 103 in the thin film transistor shown in FIG. 1B. That is, in the thin film transistor shown in FIG. 1B, the source 102 and the drain 103 are on a side of the semiconductor layer 104 facing away from the first dielectric layer 121. For example, as shown in FIG. 1B, the semiconductor layer 104 is on a surface of the first dielectric layer 121. The source 102 and the drain 103 are on the semiconductor layer 104. The second dielectric layer 122 covers the source 102, the drain 103, and the semiconductor layer 104. This implements the structure of a thin film transistor according to other embodiments. This thin film transistor has high detection sensitivity.

Figure 2A:
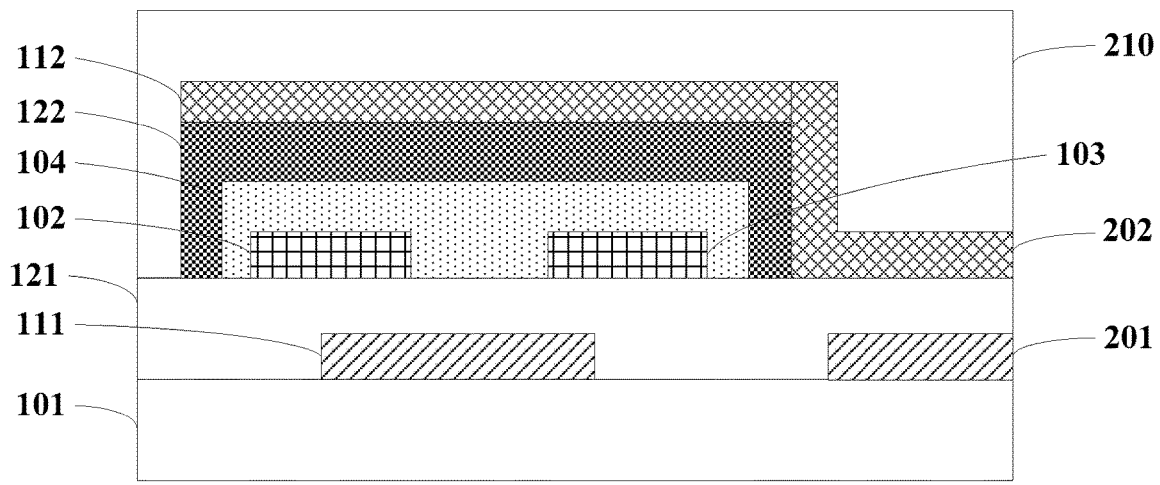
FIG. 2A is a cross sectional view showing a thin film transistor according to other embodiments of the present disclosure.

FIG. 2A is a cross sectional view showing a thin film transistor according to other embodiments of the present disclosure. The thin film transistor shown in FIG. 2A has the same or similar structure as the thin film transistor shown in FIG. 1A. These same or similar structures will not be repeated herein.

In some embodiments, as shown in FIG. 2A, the thin film transistor further comprises a first port layer 201. The first port layer 201 is above the substrate 101. The first port layer 201 is spaced apart from the first gate 111.

It should be noted that "above" as used herein may refer to that one structure or layer is on another structure or layer and the two structures or layers are in contact, or may also refer to one structure or layer is above another structure or layer and the two structures or layers are not in contact. For example, the first port layer 201 may be on the surface of the substrate 101 and in contact with the substrate 101. For another example, the first port layer 201 may be above the substrate 101 and not in contact with the substrate 101.

In some embodiments, a material of the first port layer 201 is the same as the material of the first gate 111, and the first port layer 201 is in the same layer as the first gate 111, as shown in FIG. 2A. This is easy to manufacture. It should be noted that "the same layer" refers to a layer structure formed by forming a film layer of specific patterns in the same film forming process and then patterning the film layer by a single patterning process using the same mask plate. Depending on the particular patterns, the single patterning process may comprise multiple exposure, development or etching processes, and the particular patterns in the formed layer structure may or may not be continuous. These particular patterns may also be at different heights or have different thicknesses.

In other embodiments, the first port layer 201 and the first gate 111 are in different layers. For example, the first port layer is above the first gate, and the first port layer is spaced apart from the first gate by a dielectric layer. For example, the material of the first port layer 201 comprises a conductive material (for example, metal) or the like.

In some other embodiments, the material of the first port layer 201 is different from that of the first gate 111.

In some embodiments, as shown in FIG. 2A, the thin film transistor further comprises a second port layer 202. The second port layer 202 is connected to the second gate 112. The second port layer 202 is isolated from the first port layer 201 by the first dielectric layer 121. For example, the second port layer 202 is on a side of the first dielectric layer 121 facing away from the first port layer 201.

In some embodiments, a material of the second port layer 202 is the same as the material of the second gate 112, and the second port layer 202 is in the same layer as the second gate 112. This is easy to manufacture.

In other embodiments, the second port layer 202 and the second gate 112 are in different layers. For example, the second port layer is above the second gate, and the second port layer may be connected to the second gate by a metal connection. For example, the material of the second port layer 202 comprises a conductive material such as a metal material, or the like.

In other embodiments, the material of the second port layer 202 is different from that of the second gate 112.

In the above embodiment, the first port layer and the second port layer are integrated in the thin film transistor. This allows the thin film transistor to be used for detecting the concentration or composition of a sample. A voltage signal is sent to the sample to be detected by the first port layer, and a voltage signal is received from the sample to be detected by the second port layer, so that the thin film transistor outputs a current according to the received voltage signal, and thereby the concentration or composition of the sample to be detected may be detected according to the current. Therefore, the thin film transistor is more suitable for practical applications by integrating the first port layer and the second port layer into the thin film transistor. Here, the first port layer and the second port layer are integrated in the device, which improves the integration of the device, enables the device to perform the sensing function independently, and can meet the requirements of mass production.

In the thin film transistor, the first dielectric layer functions not only as a dielectric layer for the first gate, but also as a dielectric layer between the first port layer and the second port layer. This facilitates the integration of thin film transistor. This integration simplifies the device structure and reduces the production process steps.

In some embodiments, as shown in FIG. 2A, the thin film transistor further comprises a cover layer 210 on the second gate 112 and the second port layer 202. The cover layer 210 isolates the electrolyte material from the external environment, protecting the electrolyte material, and thus improving the stability of the device.

Figure 2B:
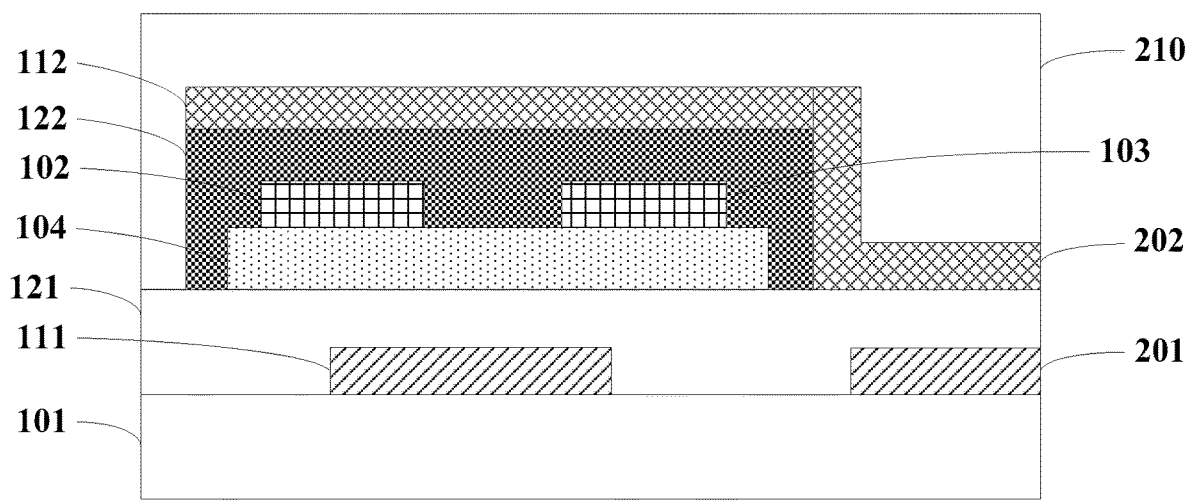
FIG. 2B is a cross sectional view showing a thin film transistor according to other embodiments of the present disclosure.

FIG. 2B is a cross sectional view showing a thin film transistor according to other embodiments of the present disclosure. On the basis of the embodiment shown in FIG. 2A, the position of the semiconductor layer 104 is interchanged with the position of the source 102/drain 103 in the thin film transistor shown in FIG. 2B. That is, in the thin film transistor shown in FIG. 2B, the source 102 and the drain 103 are on a side of the semiconductor layer 104 facing away from the first dielectric layer 121. For example, as shown in FIG. 2B, the semiconductor layer 104 is on a surface of the first dielectric layer 121. The source 102 and the drain 103 are on the semiconductor layer 104. The second dielectric layer 122 covers the source 102, the drain 103, and the semiconductor layer 104. This implements the structure of a thin film transistor according to other embodiments. This thin film transistor has high detection sensitivity.

Figure 3:
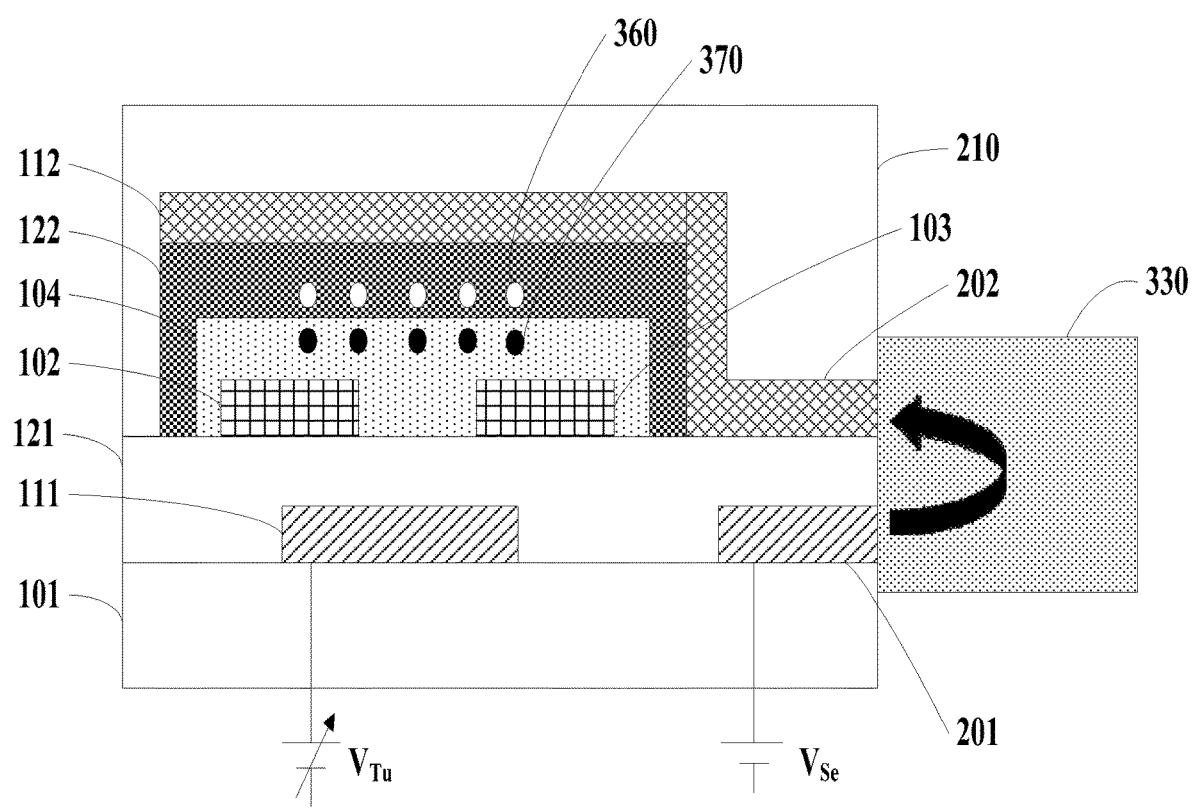
FIG. 3 is a connection diagram showing detection of a sample to be detected using a thin film transistor of some embodiments of the present disclosure.

FIG. 3 is a connection diagram showing detection of a sample to be detected using a thin film transistor of some embodiments of the present disclosure. For example, the sample to be detected is a liquid sample (e.g., a biochemical sample). For example, the thin film transistor is used to detect the concentration, biochemical composition, etc. of the sample to be detected. Additionally, ions 360 in the second dielectric layer 122 and carriers (e.g., electrons or holes) 370 in the semiconductor layer 104 are shown in FIG. 3. During the operation of the thin film transistor, these ions 360 and carriers 370 form an electric double layer under the action of an electric field.

As shown in FIG. 3, the thin film transistor may be directly contacted with the sample 330 to detect the sample. For example, a container for accommodating a sample to be detected may be provided on the port layer side of the thin film transistor, or the two port layers of the thin film transistor may be placed in the sample to be detected. For another example, a through hole may be formed through the first port layer and the second port layer, and the sample to be detected may be accommodated in the through hole, thereby the first port layer and the second port layer are directly contact with the sample to be detected respectively.

A process of detecting a sample to be detected using a thin film transistor of some embodiments of the present disclosure will be described in detail below with reference to FIG. 3.

During the detection process, an adjustment voltage $V_{Tu}$ is applied to the first gate 111 of the thin film transistor, so that the thin film transistor operates in a sensitive working range. For example, the range of the adjustment voltage $V_{Tu}$ is $-70V \leq V_{Tu} \leq 70V$. For example, the adjustment voltage $V_{Tu}$ is $-30V$, $10V$, $20V$ or the like. A detection voltage signal $V_{se}$ is applied to the first port layer 201. The first port layer 201 is used to output the detection voltage signal. This detection voltage signal is transmitted to the sample 330 to be detected via the first port layer. Since the sample to be detected has an electrical resistance, it will have a voltage dividing effect on the voltage signal. The second port layer 202 is used to receive the detection voltage signal after being divided by the sample to be detected, and transmit the detection voltage signal to the second gate. Here, the detection voltage after being divide by the sample to be detected may be referred to as to-be-detected voltage signal. This to-be-detected voltage signal is transmitted to the second gate 112, which causes the thin film transistor to be turned on, so that the thin film transistor generates a source-drain current. A output current (i.e., the source-drain current) is taken from the source 102 or the drain 103. A detection result of the sample, such as a sample concentration (or pH value), etc., is obtained based on the output current.

Studies have shown that the thin film transistor of some embodiments of the present disclosure has functions of sensing weak electrical signals, chemical signals (e.g., pH, etc.), and biological signals (e.g., antibodies, DNA, etc.). The details will be described below by way of example.

In some embodiments, the thin film transistor may be utilized to monitor changes of sample concentration. For example, in the case where the detection voltage signal applied to the first port layer does not change, when the sample concentration decreases, the resistance of the sample increases, and the divided voltage by the sample increases. Therefore, the voltage delivered to the second gate reduces, and the output current taken from the source or the drain decreases, so that a result that the sample concentration reduces is detected.

In some embodiments, the thin film transistor may be utilized to detect the biochemical composition of the sample. For example, in the case where the detection voltage signal applied to the first port layer does not change, a biochemical reagent may be added on the first port layer and the second port layer. The biochemical reagent has a certain electrical resistance. When a biochemical sample to be detected is in contact with the biochemical reagent, if the biochemical sample contains a biochemical component (for example, an antibody), and the biochemical component can react with the biochemical reagent, it will cause the resistance of the biochemical reagent to change. Thus, in the detection process using the thin film transistor shown in FIG. 3, the output current changes. The biochemical component contained in the biochemical sample to be detected is detected by detecting a change in the output current. Further, it is also possible to detect the content of the biochemical component (for example, an antibody) contained, depending on the degree of change in the output current.

In some embodiments of the present disclosure, a sensor may also be provided. The sensor comprises a thin film transistor as described above, such as the thin film transistor shown in FIG. 1A, FIG. 1B, FIG. 2A or FIG. 2B.

Figure 4:
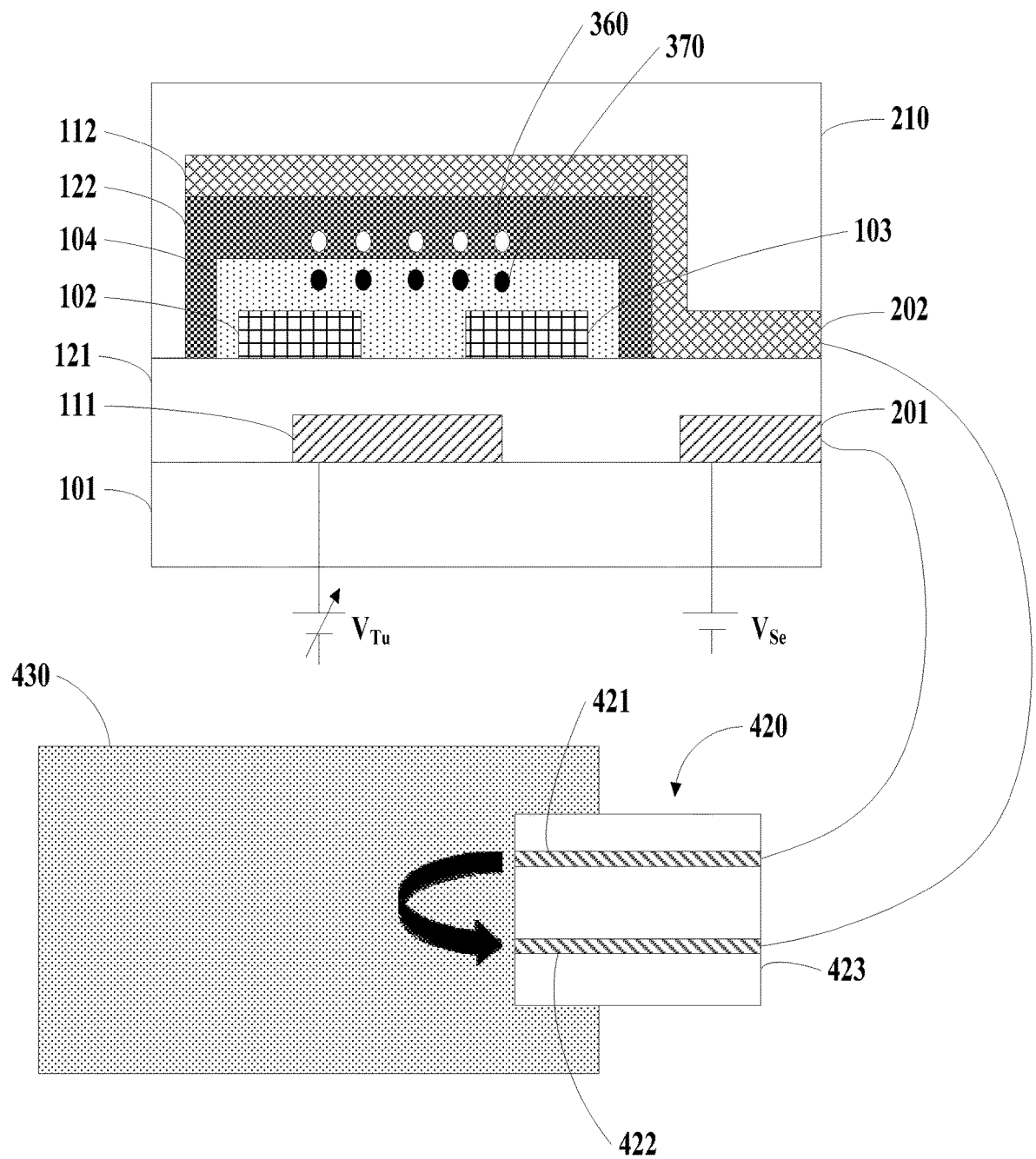
FIG. 4 is a cross sectional view showing a sensor according to some embodiments of the present disclosure.

FIG. 4 is a cross sectional view showing a sensor according to some embodiments of the present disclosure. As shown in FIG. 4, the sensor comprises a detection unit 420 in addition to the same or similar structure as the thin film transistor shown in FIG. 2A. In addition, a sample 430 to be detected is also shown in FIG. 4.

In some embodiments, as shown in FIG. 4, the detection unit 420 comprises a first detection portion 421 and a second detection portion 422. The first detection portion 421 is electrically connected to the first port layer 201 of the thin film transistor. The second detection portion 422 is electrically connected to the second port layer 202 of the thin film transistor. For example, the first detection portion 421 and the second detection portion 422 are both probes. In some embodiments, the detection unit 420 further comprises a fixing portion 423. The fixing portion 423 is used to combine the first detection portion 421 and the second detection portion 422. For example, the material of the fixing portion comprises an insulating material such as silicon nitride or the like. In this embodiment, a detection unit respectively connected to the first port layer and the second port layer is added to the sensor. In sample detection, the detection unit may be in contact with the sample to be detected, which is more convenient for detection.

In some embodiments, the detection unit is a detachable detection unit. In this way, a single-use detection unit may be used when a sample is detected, so that interference between different samples may be prevented and the accuracy of the detection may be improved. In other embodiments, the detection unit is a detection unit that may be used repeatedly, thereby resources and costs may be saved.

As shown in FIG. 4, during the operation of the sensor, the detection unit 420 is contact with the sample 430 to be detected. After a detection voltage signal $V_{Se}$ is applied to the first port layer 201, this detection voltage signal $V_{Se}$ is output by the first port layer 201 and reaches the sample 430 passing through the first detection portion 421. The detection voltage after being divided by the sample 430 (i.e., the to-be-detected voltage signal) passes through the second detection portion 422, and is transmitted to the second gate 112 via the second port layer 202. A detection result, such as a sample concentration, etc., is then obtained by taking an output current from the source 102 or the drain 103. For example, similar to the method described above, a change in sample concentration may be monitored by detecting a fluctuation in the output current. For another example, similar to the method described above, a biochemical reagent may be added on the detection unit to detect biochemical composition or the like.

Figure 5:
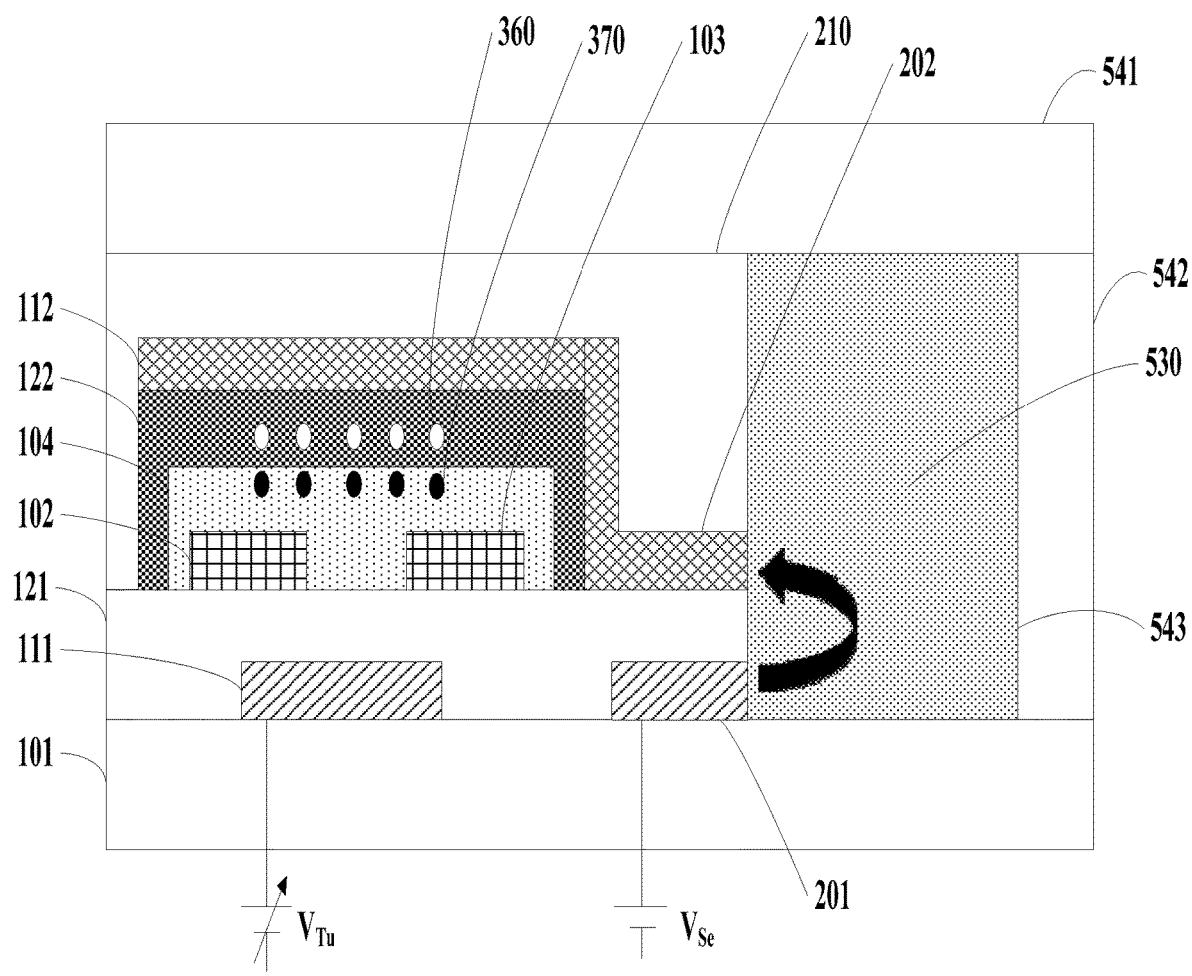
FIG. 5 is a cross sectional view showing a sensor according to other embodiments of the present disclosure.

FIG. 5 is a cross sectional view showing a sensor according to other embodiments of the present disclosure.

As shown in FIG. 5, the sensor comprises a capping plate 541 and an encapsulation portion 542 in addition to the same or similar structure as the thin film transistor shown in FIG. 2A. The capping plate 541 is disposed opposite to the substrate 101 of the thin film transistor and above the second gate 112. For example, the capping plate 541 is on the cover layer 210. The encapsulation portion 542 is between the capping plate 541 and the substrate 101. The capping plate 541, the encapsulation portion 542, and the thin film transistor enclose a flow passage 543. For example, the flow passage 543 is defined or enclosed by the substrate 101, the first port layer 201, the first dielectric layer 121, the second port layer 202, and the cover layer 210 of the thin film transistor, the capping plate 541, and the encapsulation portion 542. This flow passage 543 is a hollow structure. The first port layer 201 and the second port layer 202 of the thin film transistor abut the flow passage 543, respectively. For example, as shown in FIG. 5, a sample (for example, a liquid sample) 530 to be detected flows in a flow passage 543 in a direction perpendicular to the plane of the paper, and the characteristics of the sample are detected by the sensor.

In this embodiment, by integrating the flow passage into the sensor, the integration level of the device is improved and the sample is detected more conveniently.

In some embodiments of the present disclosure, a biological detection device is also provided. For example, the biological detection device comprises a thin film transistor as described above (for example, the thin film transistor shown in FIG. 1A, FIG. 1B, FIG. 2A or FIG. 2B). For another example, the biological detection device comprises a sensor as described above (for example, the sensor shown in FIG. 4 or FIG. 5). For example, the biological detection device is a biochemical chip (for example, a microfluidic chip) or a device containing a biochemical chip.

Figure 6:
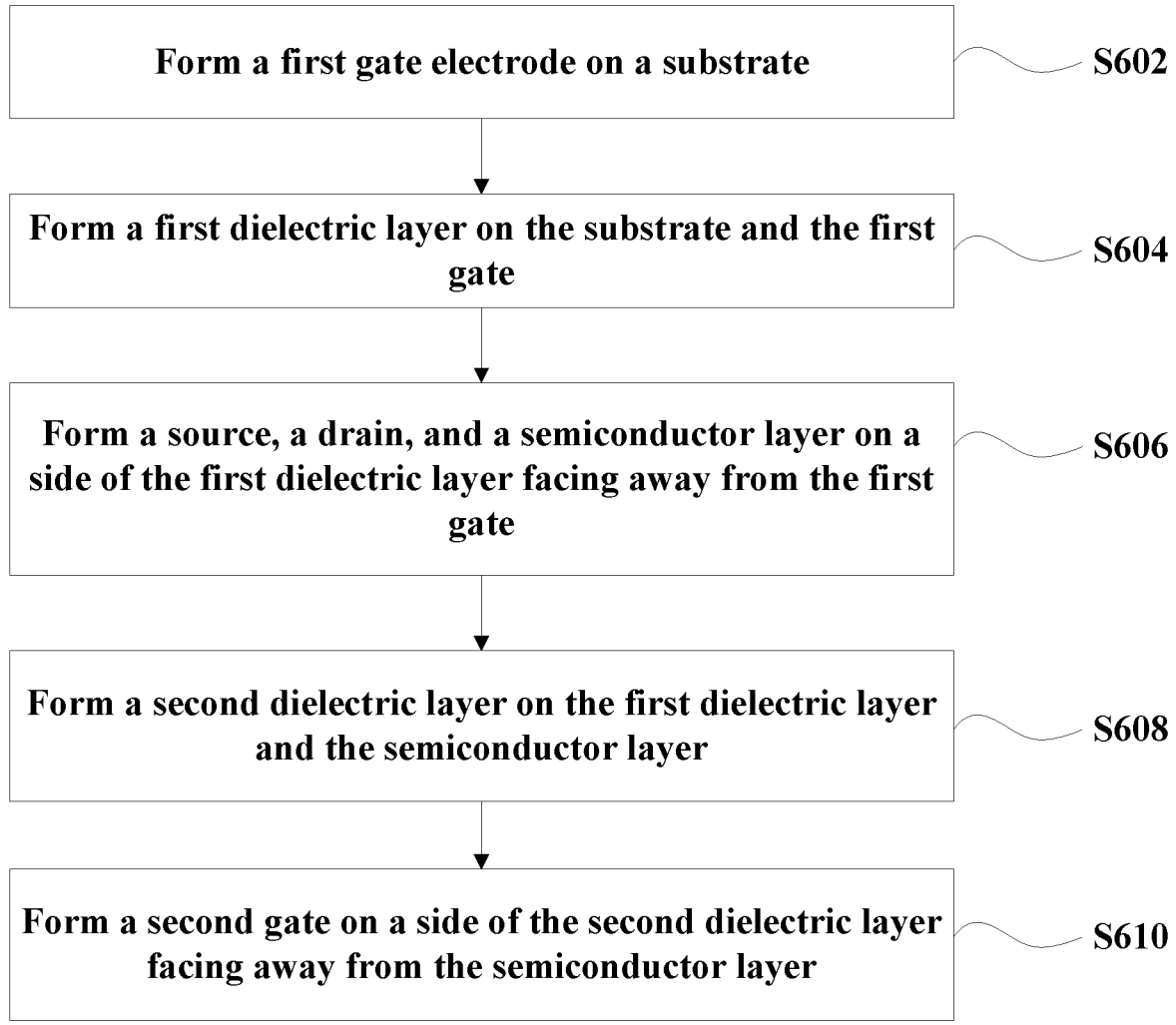
FIG. 6 is a flow chart showing a method of manufacturing a thin film transistor according to some embodiments of the present disclosure.

FIG. 6 is a flow chart showing a method of manufacturing a thin film transistor according to some embodiments of the present disclosure. FIGS. 7A to 7E are cross sectional views showing structures at several stages in the manufacture process of a thin film transistor according to some embodiments of the present disclosure. A manufacturing process of a thin film transistor according to some embodiments of the present disclosure will be described in detail below with reference to FIGS. 6, 7A to 7E, and 1A.

As shown in FIG. 6, in step S602, a first gate is formed on a substrate.

Figure 7A:
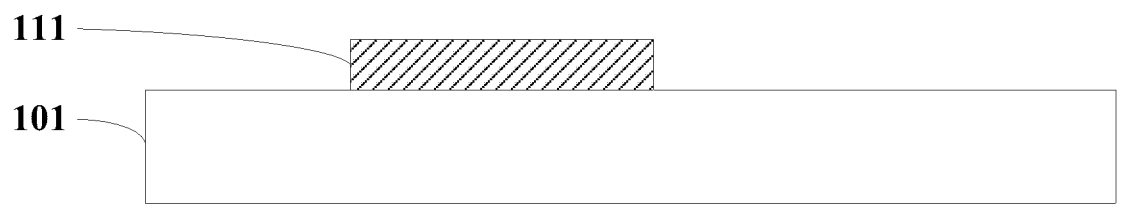
FIGS. 7A to 7E are cross sectional views showing structures at several stages in the manufacture process of a thin film transistor according to some embodiments of the present disclosure.

FIG. 7A is a cross sectional view showing the structure of step S602. As shown in FIG. 7A, a first gate 111 is formed on a substrate 101. For example, the substrate 111 is provided. The material of the substrate is an insulating material such as glass, PI (Polyimide) or the like. The substrate is then cleaned. Next, a first conductive material layer is deposited on the substrate by a process such as sputtering, evaporation or PECVD (Plasma Enhanced Chemical Vapor Deposition), and the first conductive material layer is patterned to form a first gate. For example, the patterning process may be implemented by photolithography, dry etching, wet etching, lift-off, electron beam exposure, or the like.

Returning to FIG. 6, in step S604, a first dielectric layer is formed on the substrate and the first gate.

Figure 7B:
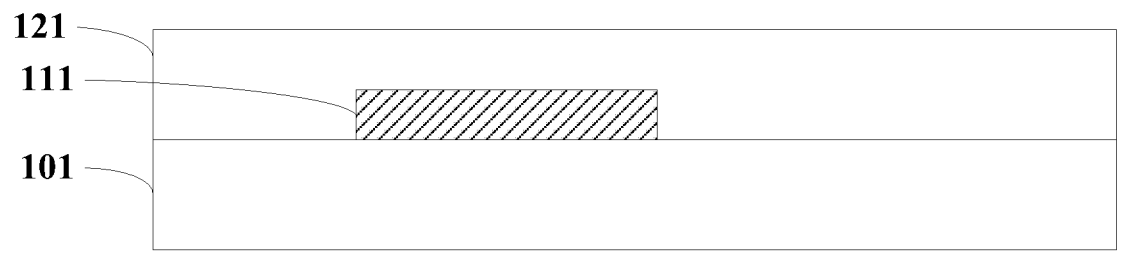

FIG. 7B is a cross sectional view showing the structure of step S604. As shown in FIG. 7B, a first dielectric layer 121 is formed on the substrate 101 and the first gate 111, for example, by a deposition process. An orthographic projection of the first gate 111 on the substrate 101 is within an orthographic projection of the first dielectric layer 121 on the substrate 101. For example, the material of the first dielectric layer is an inorganic insulating material or an organic insulating material. For an inorganic insulating material, the deposition method may be sputtering or PECVD or the like. For an organic insulating material, the deposition method may be a coating or a solution preparation (for example, a sol-gel method).

Referring to FIG. 6, in step S606, a source, a drain, and a semiconductor layer are formed on a side of the first dielectric layer facing away from the first gate. The source and the drain are respectively connected to the semiconductor layer. Both an orthographic projection of the source on the substrate and an orthographic projection of the drain on the substrate are within an orthographic projection of the semiconductor layer on the substrate.

Figure 7C:
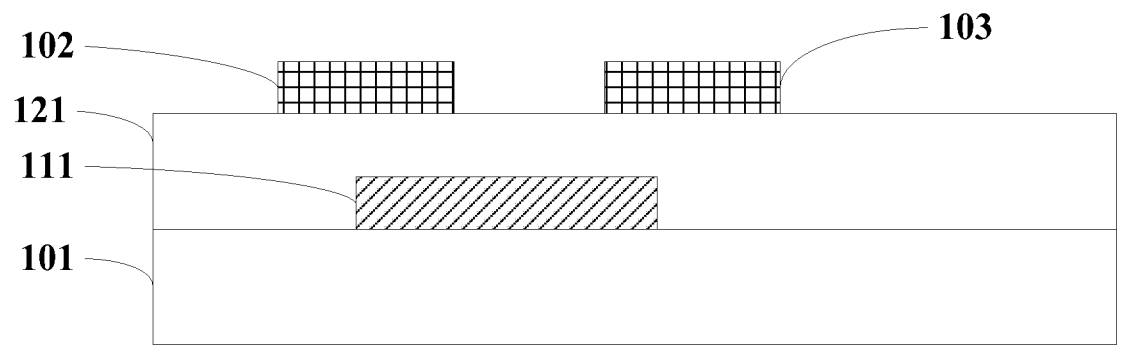
Figure 7D:
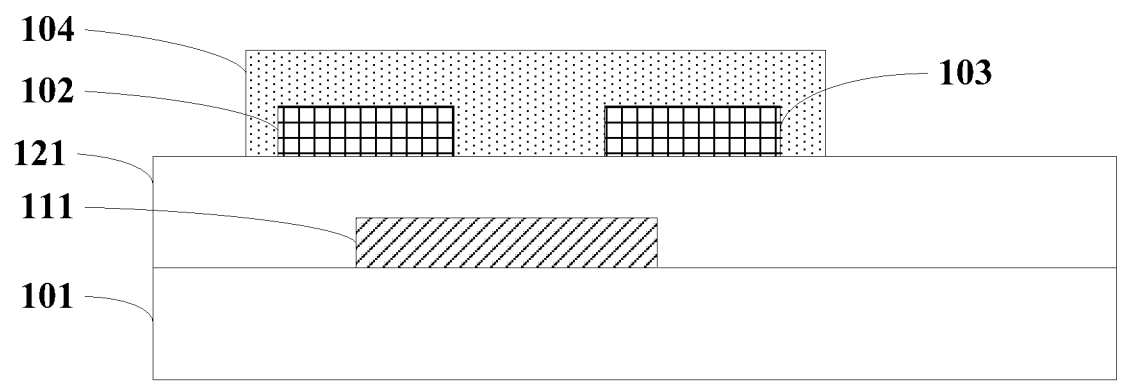

FIGS. 7C and 7D are cross sectional views showing the structures of the two stages in step S606, respectively. In some embodiments, the step S606 may comprise forming the source 102 and the drain 103 on a side of the first dielectric layer 121 facing away from the first gate 111 as shown in FIG. 7C. For example, a second conductive material layer is deposited on the first dielectric layer 121, and then the second conductive material layer is patterned to form the source 102 and the drain 103. For example, the deposition process comprises processes such as sputtering, evaporation, PECVD, or transfer. For example, the patterning process comprises processes such as photolithography, electron beam etching, dry etching, wet etching, or lift-off.

Next, in some embodiments, the step S606 further comprises forming a semiconductor layer 104 on the first dielectric layer 121, the source 102 and the drain 103 as shown in FIG. 7D. Both an orthographic projection of the source 102 on the substrate 101 and an orthographic projection of the drain 103 on the substrate 101 are within an orthographic projection of the semiconductor layer 104 on the substrate 101. For example, a semiconductor material layer covering the source 102 and the drain 103 is formed by a deposition process. The semiconductor material comprises an organic material or an inorganic material. For example, for an organic material, the deposition process comprises processes such as coating or evaporation. For another example, for an inorganic materials, the deposition process comprises processes such as sputtering, PECVD, or transfer. The semiconductor material layer is then etched (e.g., by a process such as dry etching or wet etching) to form a desired semiconductor layer 104, i.e., form a channel region. After etching, the semiconductor layer 104 exposes a portion of the first dielectric layer 121.

Returning to FIG. 6, in step S608, a second dielectric layer is formed on the first dielectric layer and the semiconductor layer.

Figure 7E:
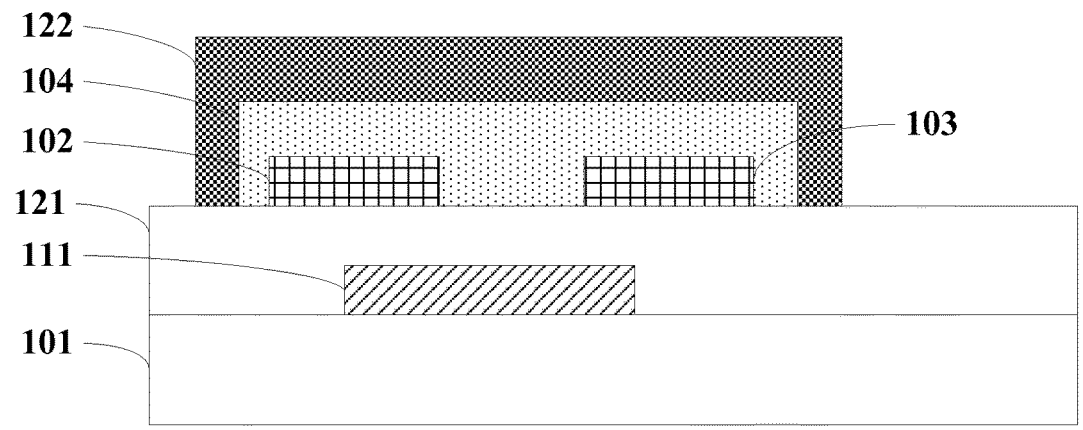

FIG. 7E is a cross sectional view showing the structure in step S608. As shown in FIG. 7E, a second dielectric layer 122 is formed on the first dielectric layer 121 and the semiconductor layer 104 by deposition and patterning processes. The material of the second dielectric layer 122 is a solid state electrolyte material. The solid state electrolyte material comprises an organic polyelectrolyte material or an inorganic porous material or the like. For example, for an organic material, the deposition process comprises processes such as coating, evaporation, or sol-gel processing. For another example, for an inorganic materials, the deposition process comprises sputtering, PECVD, or the like. For example, the patterning process comprises processes such as dry etching, wet etching, or lift-off. After patterning, the second dielectric layer 122 exposes a portion of the first dielectric layer 121. As shown in FIG. 7E, an orthographic projection of the semiconductor layer 104 on the substrate 101 is within an orthographic projection of the second dielectric layer 122 on the substrate 101.

Returning to FIG. 6, in step S610, a second gate is formed on a side of the second dielectric layer facing away from the semiconductor layer.

FIG. 1A is a cross sectional view showing the structure in step S610. As shown in FIG. 1A, a second gate 112 is formed on a side of the second dielectric layer 122 facing away from the semiconductor layer 104, for example, by deposition and etching processes.

Heretofore, a method of manufacturing a thin film transistor according to some embodiments of the present disclosure has been provided. This manufacturing method is easy to implement and convenient for mass production. A dual-gate thin film transistor based on a solid state electrolyte material is formed by this manufacturing method. This dual-gate thin film transistor has high detection sensitivity.

In other embodiments, the step S606 in FIG. 6 comprises forming a semiconductor layer on a side of the first dielectric layer facing away from the first gate. A semiconductor layer is formed on a surface of the first dielectric layer, for example, by a deposition process. Next, the step S606 further comprises forming a source and a drain on a side of the semiconductor layer facing away from the first dielectric layer. For example, a source and a drain are formed on the semiconductor layer by deposition and patterning processes. Thus, after subsequent steps, a thin film transistor as shown in FIG. 1B may be formed.

FIGS. 8A to 8F are cross sectional views showing structures at several stages in the manufacture process of a thin film transistor according to other embodiments of the present disclosure. A manufacturing process of the thin film transistor according to other embodiments of the present disclosure will be described in detail below with reference to FIGS. 8A to 8F, and 2A.

Figure 8A:
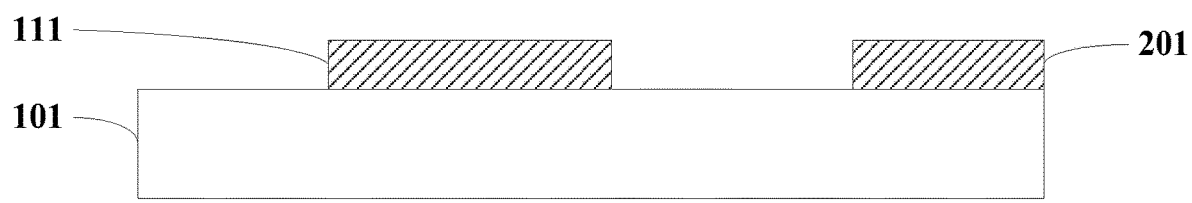
FIGS. 8A to 8F are cross sectional views showing structures at several stages in the manufacture process of a thin film transistor according to other embodiments of the present disclosure.

First, as shown in FIG. 8A, a first gate 111 is formed on a substrate 101. During formation of the first gate 111, a first port layer 201 is further formed above the substrate 101. For example, the first port layer 201 is formed on a surface of the substrate 101. The first port layer 201 is spaced apart from the first gate 111. For example, the first port layer 201 and the first gate 111 are formed in the same patterning process.

In some embodiments, the material of the first port layer 201 is the same as the material of the first gate 111. In such a case, the first gate 111 and the first port layer 201 are formed, for example, by the same patterning process. Herein "the same patterning process" refers to forming a film layer of specific patterns in the same film forming process and then forming a layer structure by patterning the film layer by a single patterning process using the same mask plate. It should be noted that, depending on the specific patterns, the single patterning process may comprise multiple exposure, development or etching processes. The specific patterns in the formed layer structure may or may not be continuous. These particular patterns may also be at different heights or have different thicknesses. For example, in this embodiment, a first conductive material layer may be formed on the substrate, and then the first conductive material layer is patterned to form the first gate 111 and the first port layer 201. This is convenient to manufacture and is conducive to mass production.

In other embodiments, the material of the first port layer 201 is different from the material of the first gate 111. In this case, the first gate 111 and the first port layer 201 may be formed on the substrate 101, respectively.

Figure 8B:
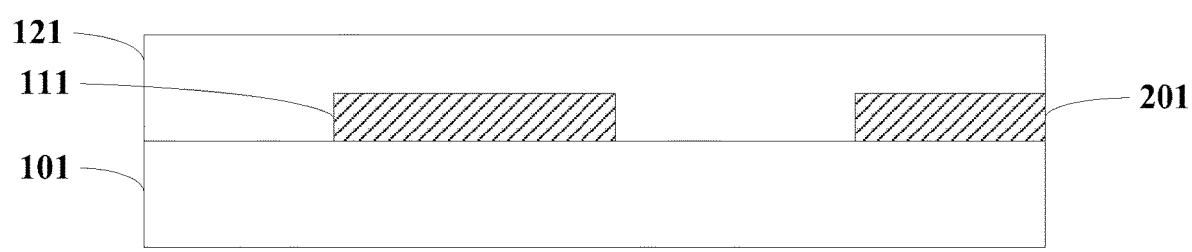

Next, as shown in FIG. 8B, a first dielectric layer 121 is formed on the substrate 101, the first gate 111 and the first port layer 201, for example, by a deposition process.

Figure 8C:
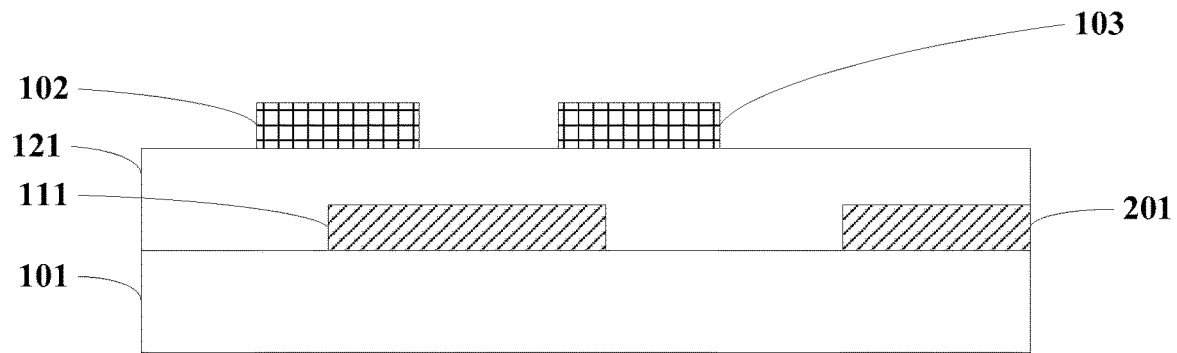

Next, as shown in FIG. 8C, a source 102 and a drain 103 are formed on a side of the first dielectric layer 121 facing away from the first gate 111, for example, by deposition and patterning processes.

Figure 8D:
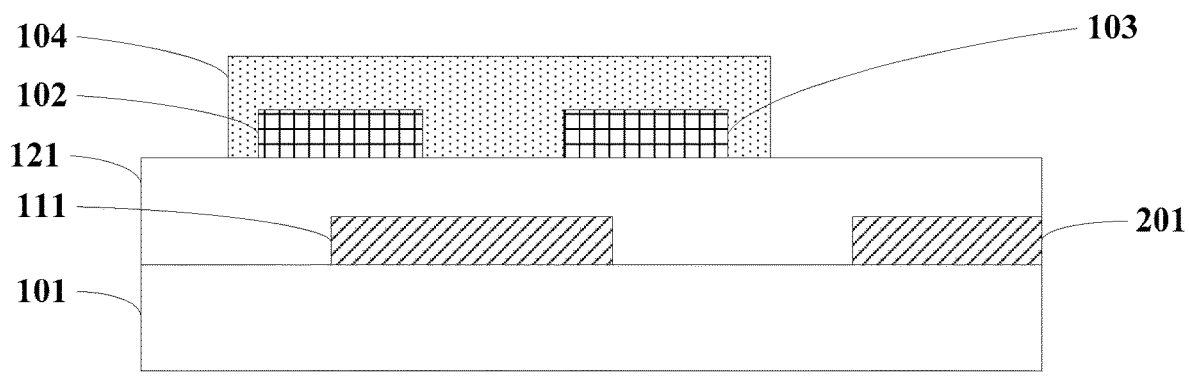

Next, as shown in FIG. 8D, a semiconductor layer 104 is formed on the first dielectric layer 121, the source 102 and the drain 103, for example, by deposition and etching processes.

In other embodiments, a semiconductor layer may be first formed on a side of the first dielectric layer facing away from the first gate, and then a source and a drain are formed on a side of the semiconductor layer facing away from the first dielectric layer.

Figure 8E:
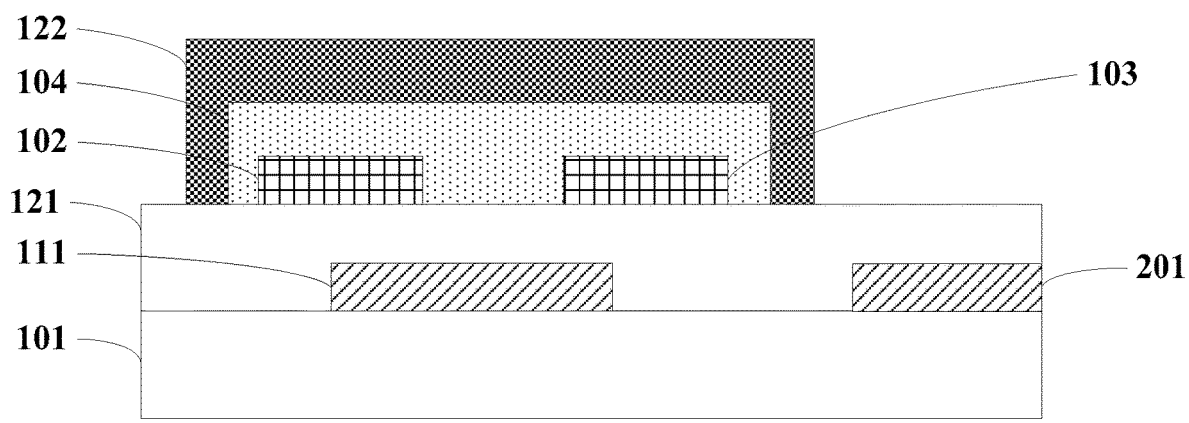

Next, as shown in FIG. 8E, a second dielectric layer 122 is formed on the first dielectric layer 121 and the semiconductor layer 104, for example, by deposition and patterning processes. The material of the second dielectric layer 122 is a solid state electrolyte material. After patterning, the second dielectric layer 122 exposes a portion of the first dielectric layer 121.

Figure 8F:
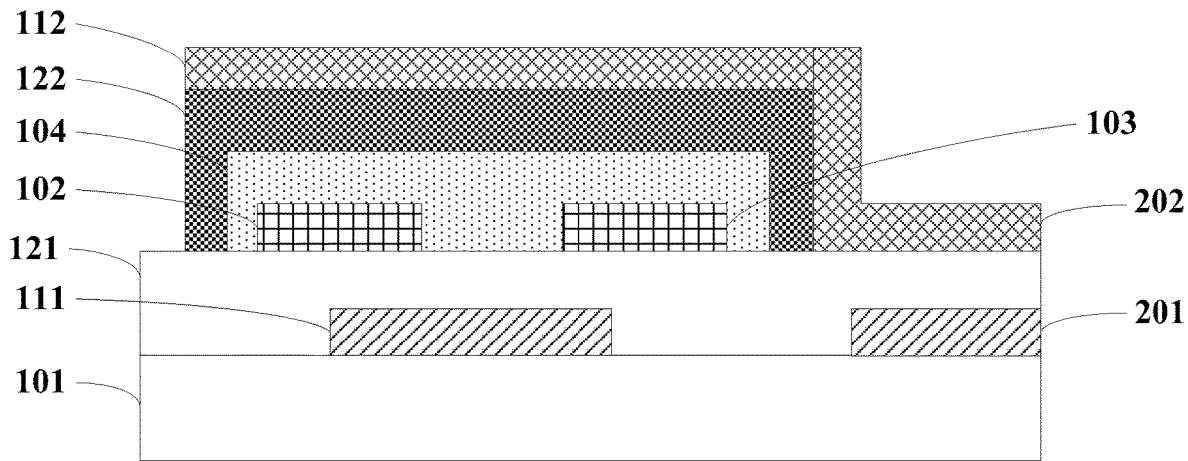

Next, as shown in FIG. 8F, a second gate 112 is formed on a side of the second dielectric layer 122 facing away from the semiconductor layer 104. During formation of the second gate 112, a second port layer 202 connected to the second gate 112 may be further formed. The second port layer 202 is isolated from the first port layer 201 by the first dielectric layer 121. For example, the second port layer 202 is on a side of the first dielectric layer 121 facing away from the first port layer 201. For example, the second port layer 202 and the second gate 112 are formed in the same patterning process.

In some embodiments, a material of the second port layer 202 is the same as a material of the second gate 112. In such a case, the second gate 112 and the second port layer 202 are formed, for example, by the same patterning process. For example, a third conductive material layer is deposited on the exposed portion of the first dielectric layer 121 and the second dielectric layer 122. A material of the third conductive material layer is the material of the second gate and the second port layer. The third conductive material layer is then patterned to form the second gate 112 and the second port layer 202. Thus, the second gate 112 and the second port layer 202 are formed together, which is convenient for manufacturing and facilitates mass production.

In other embodiments, the material of the second port layer 202 is different from the material of the second gate 112. In such a case, the second gate 112 and the second port layer 202 may be formed, respectively.

Next, as shown in FIG. 2A, a cover layer 210 is formed on the second gate 112 and the second port layer 202, for example, by a deposition process. For example, a material of the cover layer 210 comprises an organic insulating material or an inorganic insulating material.

Heretofore, a method of manufacturing a thin film transistor according to other embodiments of the present disclosure has been provided. In the manufacturing method, the first port layer and the second port layer are also integrated into the thin film transistor, which improves the integration of the device and is convenient for mass production. In addition, by forming the cover layer in the manufacturing method, it is possible to enhance the reliability and stability of the device.

Figure 9:
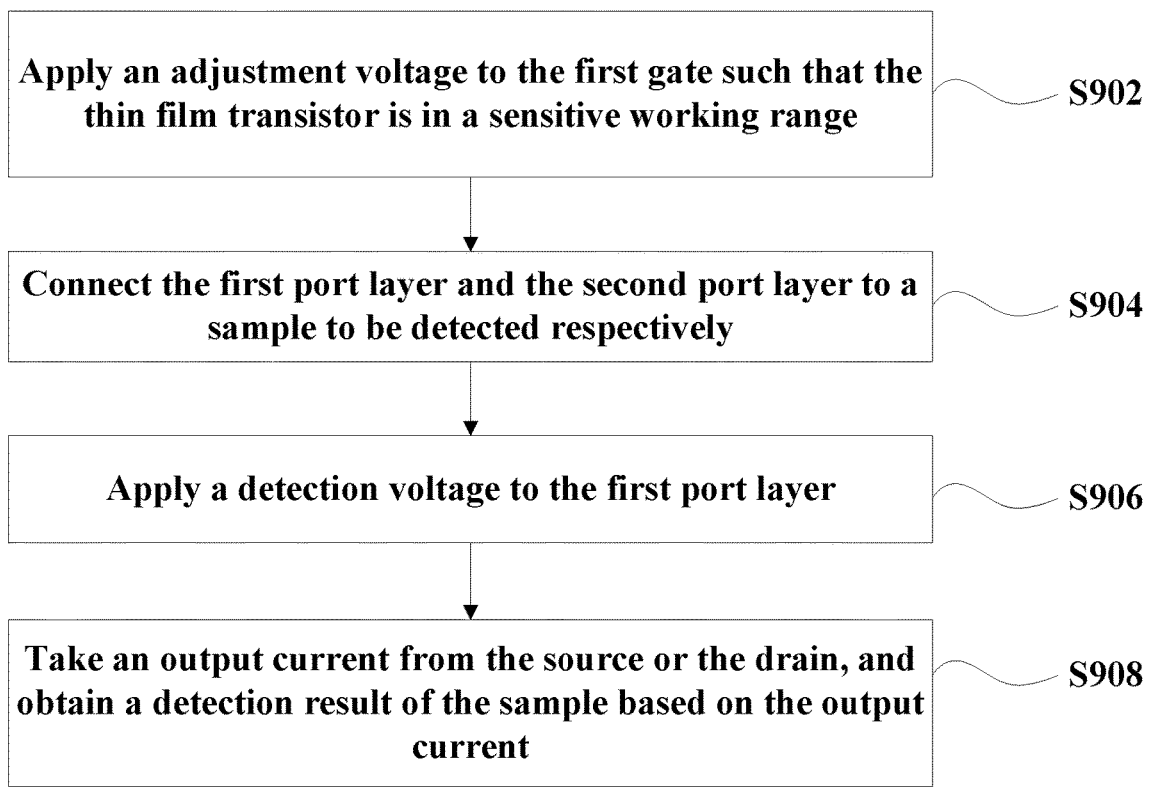
FIG. 9 is a flow chart showing a method of detecting a sample using a thin film transistor of some embodiments of the present disclosure.

FIG. 9 is a flow chart showing a method of detecting a sample using a thin film transistor of some embodiments of the present disclosure. For example, the method may be implemented using a thin film transistor as shown in FIG. 2A or FIG. 2B. As shown in FIG. 9, the method comprises steps S902 to S908.

In step S902, an adjustment voltage is applied to the first gate such that the thin film transistor is in a sensitive working range. The sensitive working range is a voltage range in which the output current of the thin film transistor is sensitive to the voltage applied to the second gate. The output current is more sensitive to the voltage applied to the second gate in this voltage range than in other voltage ranges.

In step S904, the first port layer and the second port layer are respectively connected to a sample to be detected. For example, as shown in FIG. 3, the first port layer and the second port layer may be directly contact with the sample to be detected, respectively. For another example, as shown in FIG. 4, a detection unit connected to the thin film transistor may be in contact with the sample to be detected such that the first port layer and the second port layer are respectively connected to the sample.

In step S906, a detection voltage is applied to the first port layer. The detection voltage is applied to the sample via the first port layer and a first detection portion (if any). Then, the second port layer receives the detection voltage (i.e., to-be-detected voltage signal) after being divided by the sample via a second detection portion (if any), and transmits the detection voltage to the second gate. This causes a current produced between the source and the drain.

In step S908, an output current is taken from the source or the drain, and a detection result of the sample is obtained based on the output current. For example, a sample concentration is detected based on the output current (i.e., source-drain current). For another example, the thin film transistor (or a sensor comprising the thin film transistor) is used to perform real-time monitoring of sample concentration, or to detect biochemical composition of the sample or the like.

In the method of this embodiment, an adjustment voltage is applied to the first gate such that the thin film transistor is in a sensitive working range. The first port layer and the second port layer are then respectively connected to the sample to be detected. After applying a detection voltage to the first port layer, an output current is taken from the source or the drain, and a detection result of the sample is obtained based on the output current. This method increases the sensitivity of sample detection.

In some embodiments, before step S902, the method further comprises obtaining the sensitive working range of the thin film transistor.

In some embodiments, the step of obtaining the sensitive working range comprises applying a scan voltage $V_G$ to the second gate. For example, the scan voltage $V_G$ is applied to the second port layer by a second detection portion (if any), which is applied to the second gate via the second port layer. In some embodiments, the step of obtaining the sensitive working range further comprises obtaining a current $I_D$ from the source or the drain to obtain an $I_D$-$V_G$ characteristic curve (i.e., a current-voltage characteristic curve) regarding the current $I_D$ and the scan voltage $V_G$. In some embodiments, the step of obtaining the sensitive working range further comprises determining a voltage range with the largest slope of curve from the $I_D$-$V_G$ characteristic curve (i.e., the minimum subthreshold swing in the TFT transfer characteristic curve) as the sensitive working range of the thin film transistor. This embodiment achieves the effect of obtaining a sensitive working range of the thin film transistor.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified or equivalently substituted for part of the technical features without departing from the scope and spirit of the present disclosure. The scope of the disclosure is defined by the following claims.

What is claimed is:
1. A thin film transistor, comprising:
a substrate;
a first gate on the substrate;
a first dielectric layer on the substrate and the first gate, wherein an orthographic projection of the first gate on the substrate is within an orthographic projection of the first dielectric layer on the substrate;
a source, a drain, and a semiconductor layer on a side of the first dielectric layer facing away from the first gate, the source and the drain being respectively connected to the semiconductor layer, both an orthographic projection of the source on the substrate and an orthographic projection of the drain on the substrate being within an orthographic projection of the semiconductor layer on the substrate;
a second dielectric layer on the first dielectric layer and the semiconductor layer, a material of the second dielectric layer being a solid state electrolyte material, wherein the orthographic projection of the semiconductor layer on the substrate is within an orthographic projection of the second dielectric layer on the substrate; and
a second gate on a side of the second dielectric layer facing away from the semiconductor layer.
2. The thin film transistor according to claim 1, further comprising:
a first port layer above the substrate, the first port layer being spaced apart from the first gate; and
a second port layer connected to the second gate, the second port layer being isolated from the first port layer by the first dielectric layer.

3. The thin film transistor according to claim 2, wherein
a material of the first port layer is the same as a material of the first gate, and the first port layer is in the same layer as the first gate;
a material of the second port layer is the same as a material of the second gate, and the second port layer is in the same layer as the second gate.

4. The thin film transistor according to claim 2, further comprising:
a cover layer on the second gate and the second port layer.

5. The thin film transistor according to claim 1, wherein
the solid state electrolyte material comprises at least one of an organic polyelectrolyte material and an inorganic electrolyte material.

6. The thin film transistor according to claim 1, wherein
the source and the drain are between the semiconductor layer and the first dielectric layer;
or
the source and the drain are on a side of the semiconductor layer facing away from the first dielectric layer.

7. A sensor, comprising: the thin film transistor of claim 2.

8. The sensor according to claim 7, further comprising a detection unit, wherein the detection unit comprises:
a first detection portion electrically connected to the first port layer of the thin film transistor; and
a second detection portion electrically connected to the second port layer of the thin film transistor.

9. The sensor according to claim 7, further comprising:
a capping plate disposed opposite to the substrate of the thin film transistor and above the second gate; and
an encapsulation portion between the capping plate and the substrate;
wherein, the capping plate, the encapsulation portion and the thin film transistor enclose a flow passage, the first port layer and the second port layer of the thin film transistor respectively abutting the flow passage.

10. A biological detection device, comprising the thin film transistor of claim 1.

11. A biological detection device, comprising the sensor of claim 7.

12. A method of manufacturing a thin film transistor, comprising:
forming a first gate on a substrate;
forming a first dielectric layer on the substrate and the first gate, wherein an orthographic projection of the first gate on the substrate is within an orthographic projection of the first dielectric layer on the substrate;
forming a source, a drain, and a semiconductor layer on a side of the first dielectric layer facing away from the first gate, the source and the drain being respectively connected to the semiconductor layer, both an orthographic projection of the source on the substrate and an orthographic projection of the drain on the substrate being within an orthographic projection of the semiconductor layer on the substrate;
forming a second dielectric layer on the first dielectric layer and the semiconductor layer, a material of the second dielectric layer being a solid state electrolyte material, wherein the orthographic projection of the semiconductor layer on the substrate is within an orthographic projection of the second dielectric layer on the substrate; and
forming a second gate on a side of the second dielectric layer facing away from the semiconductor layer.

13. The method according to claim 12, further comprising:
forming a first port layer above the substrate during formation of the first gate, the first port layer being spaced apart from the first gate; and
forming a second port layer connected to the second gate during formation of the second gate, wherein the second port layer is isolated from the first port layer by the first dielectric layer.

14. The method according to claim 13, wherein
the first port layer and the first gate are formed in the same patterning process;
the second port layer and the second gate are formed in the same patterning process.

15. The method according to claim 13, further comprising:
forming a cover layer on the second gate and the second port layer.

16. The method according to claim 12, wherein the step of forming the source, the drain and the semiconductor layer comprises:
forming the source and the drain on a side of the first dielectric layer facing away from the first gate; and
forming the semiconductor layer on the first dielectric layer, the source and the drain;
or
forming the semiconductor layer on the side of the first dielectric layer facing away from the first gate; and
forming the source and the drain on a side of the semiconductor layer facing away from the first dielectric layer.

17. A method of detecting a sample using a thin film transistor, wherein the thin film transistor comprises: a substrate; a first gate on the substrate; a first dielectric layer on the substrate and the first gate; a source, a drain, and a semiconductor layer on a side of the first dielectric layer facing away from the first gate, the source and the drain being respectively connected to the semiconductor layer; a second dielectric layer on the first dielectric layer and the semiconductor layer, a material of the second dielectric layer being a solid state electrolyte material; a second gate on a side of the second dielectric layer facing away from the semiconductor layer; a first port layer above the substrate, the first port layer being spaced apart from the first gate; and a second port layer connected to the second gate, the second port layer being isolated from the first port layer by the first dielectric layer;
the method comprising:
applying an adjustment voltage to the first gate such that the thin film transistor is in a sensitive working range;
connecting the first port layer and the second port layer to a sample to be detected, respectively;
applying a detection voltage to the first port layer; and
obtaining an output current from the source or the drain, and obtaining a detection result of the sample according to the output current.

18. The method according to claim 17, before applying an adjustment voltage to the first gate, the method further comprising:
obtaining the sensitive working range of the thin film transistor.

19. The method according to claim 18, wherein the step of obtaining the sensitive working range comprises:
applying a scan voltage ($V_G$) to the second gate;
obtaining a current ($I_D$) from the source or the drain to obtain an $I_D$-$V_G$ characteristic curve regarding the current ($I_D$) and the scan voltage ($V_G$); and determining a voltage range with a largest slope of curve from the $I_D$-$V_G$ characteristic curve as the sensitive working range of the thin film transistor.

* * * * *